United States Patent [19]

Anderson et al.

[11] 4,135,952
[45] Jan. 23, 1979

[54] PROCESS FOR ANNEALING SEMICONDUCTOR MATERIALS

[75] Inventors: C. Lawrence Anderson, Pacific Palisades; Howard L. Dunlap, Grenada Hills, both of Calif.

[73] Assignee: Hughes Aircraft Company, Culver City, Calif.

[21] Appl. No.: 838,612

[22] Filed: Oct. 3, 1977

[51] Int. Cl.$^2$ .......................................... H01L 21/477
[52] U.S. Cl. .................................................. 148/1.5
[58] Field of Search ................................ 148/1.5, 171

[56] References Cited
U.S. PATENT DOCUMENTS 4,026,735  5/1977  Kamath et al. ...................... 148/171

Primary Examiner—M. J. Andrews
Attorney, Agent, or Firm—William J. Bethurum; W. H. MacAllister

[57] ABSTRACT

The specification describes a process for annealing electronic material, and particularly semiconductor crystals, wherein the material is submerged in a molten solution which contains the element or elements which comprise the material as solute. The solution is maintained at a temperature near the point at which the melt is saturated with solute. However, the material being annealed is physically isolated from actual contact with the solution by a gas-porous and liquid-tight container in a manner that exposes the material only to equilibriating gases from the molten solution during the annealing process. Thus, dissociation and decomposition of a semiconductor material during annealing is prevented by these equilibriating gases while using this extremely simple, unique and novel procedure which insures that no solid (other than the material holder) or liquid makes actual contact with the semiconductor material being annealed. Such procedure eliminates both cleaning problems and precise vapor pressure control problems which are characteristic of the known prior art.

2 Claims, 3 Drawing Figures

PROCESS FOR ANNEALING SEMICONDUCTOR MATERIALS

FIELD OF THE INVENTION

This invention relates generally to semiconductor heat treatment processes and more particularly to an improved semiconductor anneal process which is carried out in an equilibriating gaseous atmosphere.

BACKGROUND

In the field of annealing various semiconductor materials, such as ion-implanted silicon and gallium arsenide wafers for the purpose of electrically activating these wafers, it is known that the annealed semiconductor crystals will, upon heating beyond certain elevated temperatures, dissociate and decompose unless they are maintained in a carefully controlled environment. Thus, several processes have evolved for the purpose of either impeding or altogether preventing the escape of elemental gases from the surface of the semiconductor crystal being annealed at a prescribed elevated temperature, typically in excess of 800° C.

Known methods for preventing such dissociation and decomposition of semiconductor crystals subjected to these elevated anneal temperatures include:

(1) controlling the vapor pressure surrounding the semiconductor crystal during annealing in order to create an equilibriating environment at the crystal's surface, and (2) encapsulating the semiconductor crystal in a selected solid or powder (powdered solid) in order to create an interface barrier at the crystal's surface which also serves to impede the flow of elemental vapors away from the semiconductor crystal. Some solid encapsulants which have been used for this purpose include $SiO_2$, $Si_3N_4$, Al and other amorphous dielectrics.

The first of the above two prior approaches often requires critical pressure control of the environment surrounding the crystal and the vapor pressures therein in order to maintain a controlled equilibriating condition at the crystal surface. Additionally, when equilibrating gas streams are passed over a plurality of semiconductor wafers being annealed, this generally requires elaborate gas flow equipment and careful control over both the reactant materials of the gas flow process and the differential temperatures required thereby.

An example of this first approach is disclosed by R. M. Malbon et al. in an article entitled, "Annealing of Ion Implanted GaAs In a Controlled Atmosphere", *Journal of the Electrochemical Society: Solid-State Science & Technology*, Sept. 1976 at pages 1413–1415.

On the other hand, the second of the above two prior approaches creates obvious cleaning and contamination problems as a result of the direct physical contact between the semiconductor crystal and the surrounding solid or powdered encapsulating material. An example of this second approach is described by A. A. Immorlica et al. in an article entitled, "Capless Annealing of Ion Implanted GaAs", *Applied Physics Letters*, Vol. 29, No. 2, July 15, 1976 at pages 94–95.

THE INVENTION

Therefore, the general purpose of the present invention is to provide a new and improved process for annealing electronic materials which overcomes the above-described disadvantages of the above two prior art approaches, and yet simultaneously affords a quick, easy, economical and reliable heat treatment process for annealing these materials in a desired controlled equilibriating atmosphere. The present invention possesses most, if not all, of the advantages of the above prior art approaches, while exhibiting none of their significant disadvantages.

To accomplish this purpose, we have discovered and therefore developed a controlled ambient annealing process for preventing semiconductor crystal dissociation and decomposition. This process involves enclosing the semiconductor crystal in a liquid-tight but gas-porous container, and thereafter immersing the container in a solution which contains the elemental component or components of the crystal as solute and which is maintained at a predetermined elevated anneal temperature. Using our process, the semiconductor crystal being annealed is brought into direct intimate contact with chosen equilibriating gases, while simultaneously being completely isolated from any solid or liquid contact with the source of such gases. In this manner, equilibriating conditions are quickly established at the semiconductor crystal surface by controlling the temperature and elemental saturation conditions of the source solution from which these equilibriating gases flow.

Accordingly, it is an object of the present invention to provide a new and improved process for the heat treatment of semiconductors or other electronic materials which require annealing.

Another object is to provide an annealing process of the type described wherein gaseous equilibriating conditions are quickly, easily and uniformly provided and controlled at a semiconductor crystal surface without requiring either elaborate or sophisticated vapor pressure control techniques or the direct contact with crystal-encapsulating solid, powder, or liquid materials.

A further object is to provide a new, improved and economical process of the type described which is reliable in terms of reproducibility.

Yet a further object is to provide a new and improved process of the type described which is not limited to any particular container or configuration or geometry for housing the semiconductor crystals during annealing.

A feature of this invention is the provision of an annealing process of the type described which requires no original equipment and in fact may be carried out using the existing epitaxial growth equipment disclosed in the Kamath et al. U.S. Pat. No. 4,026,735, assigned to the present assignee.

These and other objects and features of the invention will become more readily apparent in the following description of the accompanying drawing.

DRAWINGS

Figure 1:
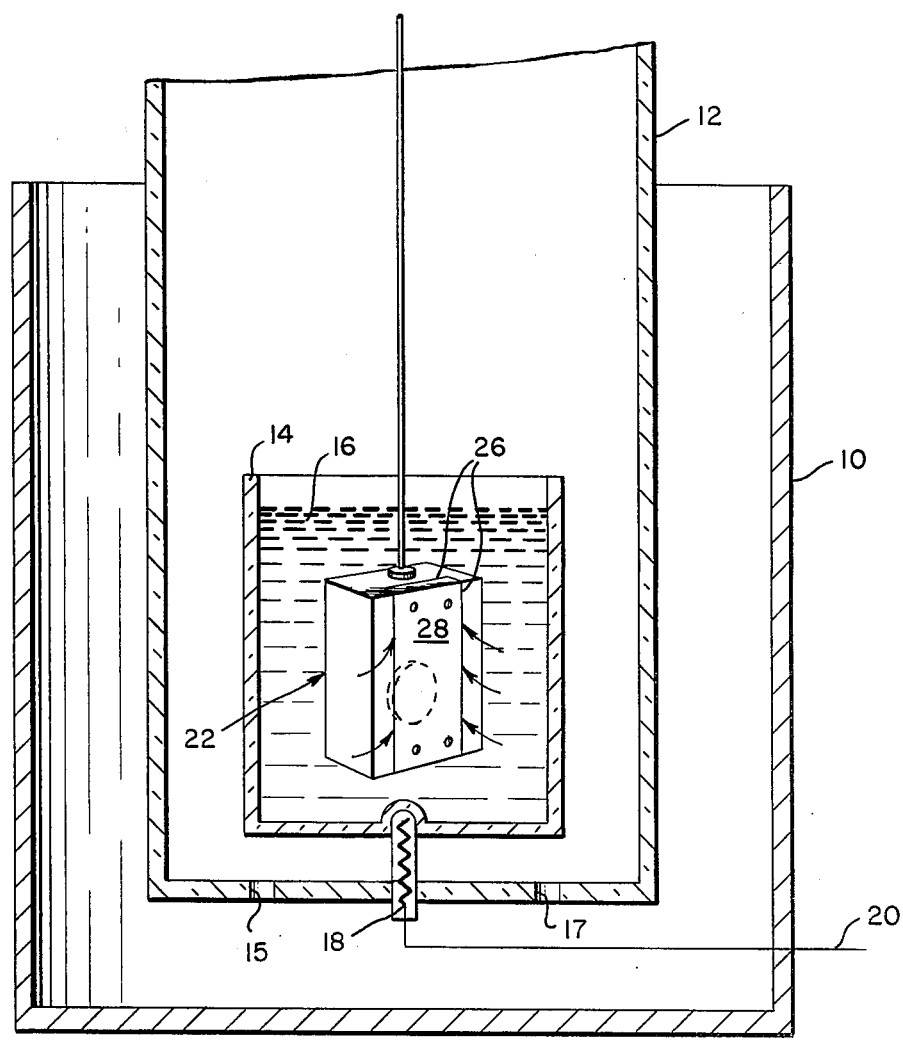
FIG. 1 is a schematic cross-section view of apparatus suitable for use in practicing the invention.

Referring now to FIG. 1, there is shown a conventional crystal growth or heat treatment furnace 10 which encloses a quartz tube 12 utilized for the containment of purifying gases from a suitable gas source (not shown). Such gases are traditionally used for maintaining an impurity free environment at the crucible 14 and are free to pass through the openings 15 and 17 in the lower wall of the tube 12. Typical crucible materials are graphite and quartz. The crucible 14 is filled with a solution 16 containing the same element or elements which comprise the electronic material to be annealed. By way of example, if a gallium arsenide wafer is to be annealed, a suitable annealing solution will be a saturated solution of gallium arsenide in gallium. Preferably, this solution of GaAs in Ga should be maintained initially at temperatures on the order of about 800° C. Typical annealing times are of the order of one-half hour.

A thermocouple unit 18 is positioned as shown to provide the desired closed loop temperature control for the anneal gas source solution 16, and the apparatus members 10, 12, 14, 18 and the closed loop temperature control lead 20 may be the same as those disclosed, for example, in the Kamath et al. U.S. Pat. No. 4,026,735, assigned to the present assignee.

When the equilibriating gas source solution 16 is brought up to a chosen elevated temperature on the order of about 800° C. and when one or more semiconductor wafers 25 have been properly enclosed in the container 22, the liquid-tight and gas-porous container 22 is inserted downwardly into the solution 16 by means of a conventional vertical push rod 24. As shown in FIG. 1, it is preferred that the container 22 be completely submerged in the anneal gas source solution. In this position, elemental or compound anneal gases will pass from the solution 16 and through the narrow passages 26 surrounding the container face plate 28 and into direct contact with the wafer 25.

Figure 2:
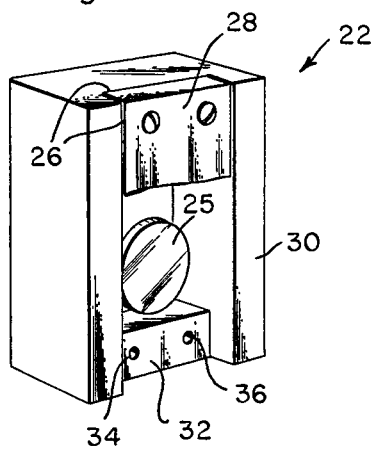
FIG. 2 is a partially cut-away isometric view of the semiconductor material holder of FIG. 1.

Referring now to FIG. 2, the liquid-tight and gas-porous container 22 is shown in a partially cut-away isometric view and includes an outer graphite casing 30 to which an interior seat or wafer carrier 32 is secured for receiving one or more of the semiconductor wafers 25. The carrier 32 includes threaded openings e.g., 34 and 36, as shown, for receiving cover plate screws e.g., 38 and 40 which secure the cover plate 28 adjacent to the casing 30 in the position shown in FIG. 2. Another seat member (not shown) is hidden by the upper portion of the cover plate 28, and this hidden seat member actually receives the two screws 38 and 40 in threaded engagement. The cover plate 28 is vertically coextensive with the vertical or length dimension of the casing 30.

When the cover plate 28 is secured in place to completely shield the semiconductor wafer 25 from view, as indicated in FIG. 1, the plate-to-casing machining tolerances are chosen to provide the very narrow passage 26 between the casing 30 and the cover plate 28. This passage 26 extends continuously around the cover plate 28 so as to leave a long narrow passageway or opening in both the front face and the top and bottom surfaces of the container 22. Thus, when a gallium arsenide wafer is inserted in the container 22, and the cover plate 28 is secured in place and the container 22 is submerged into a saturated solution 16 of gallium arsenide in gallium, equilibriating gases of gallium arsenide will flow from the GaAs in Ga liquid solution 16 and through opening 26 and into the container 22 to produce an equilibriating gaseous environment therein. At the same time, however, the opening 26 in the container 22 is sufficiently narrow to completely prevent the flow of any of the liquid solution 16 into the interior compartment of the container 22. Typically, the opening 26 should be less than 15 micrometers in width to exclude the liquid surrounding the container 22. However, it should be understood that a perforated cover (not shown) can be used in place of, or in addition to, the opening 26 and substituted for the cover 28 in order to admit gases into the container 22. The perforations or passages in this alternative cover should have diameters which are compatible with the viscosity of the anneal gas source solution (liquid) and sufficiently small so that the surface tension and wetting ability of this solution prevents any flow of liquid to the interior of the container 22. This latter construction would, therefore, allow the removable cover to fit tightly against the interior walls of the casing 30.

The container 22 will be maintained in the position shown in FIG. 1 and at a chosen anneal temperature and for a predetermined anneal time, depending upon the particular anneal requirements of a given semiconductor wafer or group of wafers enclosed in the container 22. For example, certain anneal times and temperatures are required for electrically activating different dopant ion species of ion-implanted semiconductor materials. Similarly, certain types of crystal lattice damage to semiconductors, such as may be caused by proton or inert ion bombardment, require other anneal times and temperatures for the damage removal. Therefore, it will be understood that the present invention is not limited to any particular anneal time or temperature for the material 25 being treated, and these values may be found in state-of-art textbook materials on the various heat treatments of electronic materials. Similarly, it will also be understood that the present invention is not limited to the particular type of material 25 being treated or the particular ambient gas source solution 16 therefor. It will be appreciated, however, that the source solution 16 will contain the same element or elements which comprise the semiconductor wafer material 25 so as to establish an equilibriating condition at the wafer surface when the wafer is positioned as shown in FIG. 1. This will prevent or substantially impede dissociation or dissolution of the material 25 by preventing the escape of molecules at the surface of the material 25 during the annealing process.

Figure 3:
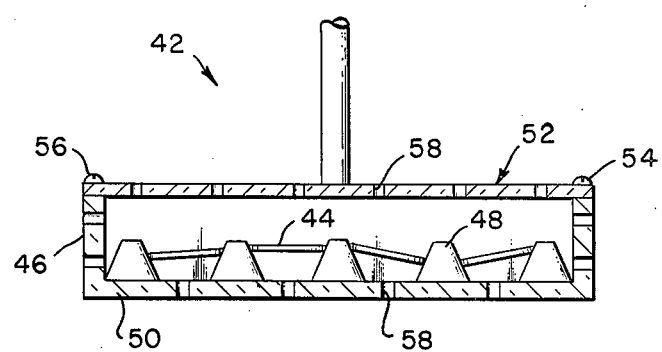
FIG. 3 is a cross-section view of a perforated wafer tray type container and push rod structure useful in annealing a plurality of semiconductor wafers in accordance with the present process.

Referring now to FIG. 3, there is shown a wafer tray container 42 which may be used advantageously when annealing a plurality of semiconductor wafers 44. The container 42 includes a support crucible 46 having a wafer tray 48 either firmly secured to or integral with its horizontal base plate 50. The wafer tray 48 will typically include a plurality of gently contoured mesas with their sides adapted to receive the wafers 44 in the position shown. Thus, the particular mesa construction of the wafer tray 48 facilitates the easy loading and unloading of the wafers 44 into the container 42, and it is not necessary that the wafers 44 be positioned in a true horizontal position.

A combination cap and push rod member 52 will be secured in the position shown after the wafers 44 have been loaded for annealing and there maintained in place by screws 54 and 56. Both the cover member 52 and the support crucible 50 have been machined to cut the small openings 58 therein which permit gases to enter the container 42 when it is submerged into the solution 16. These holes will typically have a diameter in the range of 0.0005 inches for anneal gas source solutions such as gallium arsenide in gallium. Another method of admitting gases into the container 42 would be to cover larger holes with a carbon foam or cloth which is tightly woven sufficiently to exclude the liquids involved.

Preferably, both the cover 52 and the support crucible 46 are either a glass, such as quartz, or graphite, both of which are capable of withstanding the elevated anneal temperatures on the order of 800° C. or greater and are also non-reactive with the material being annealed or the anneal gas source solution.

Similarly, the wafer tray 48 may be of the same material as the crucible 50 (and integral therewith), or the wafer tray 48 may be a separate member which is also capable of withstanding these elevated anneal temperatures. If the tray 48 is a separate member, it may be bonded to the base plate 50 of the crucible 46 using a suitable high temperature cement and premachined to have openings for gas flow which are concentric and aligned with the openings in the base plate 50. Thus, the wafer tray 48 may be fabricated from high temperature materials which have a hardness ratio less than that of the outer crucible 46 and therefore more compatible for receiving thin, fragile semiconductor wafers in the position shown in FIG. 3.

Various modifications may be made in the wafer containers described herein without departing from the scope of this invention. For example, a wafer holder of the construction shown in U.S. Pat. No. 4,026,735 can be used in practicing the present process. However, care must be taken in using all of the above wafer containers that the diameters of the gas flow openings in each container be suitable for the specific viscosity of each gas source solution used and for the surface tension of the liquid thereof. For solutions with high viscosities, relatively large diameter gas flow openings may be used as long as the surface tension, or wetting ability of the liquid does not admit liquid into the container. Conversely, for low viscosity solutions, relatively small diameter gas flow openings must be used.

Also, in the selection of materials for the wafer containers, care must be taken to choose materials which do not produce unacceptable amount of impurities when heated to elevated anneal temperatures on the order of 800° C., and which do not react or combine with the substances being annealed at this temperature.

What is claimed is:

1. A process for annealing semiconductor materials and simultaneously preventing their crystal dissociation and decomposition comprising:
   (a) enclosing a semiconductor crystal in a liquid-tight and gas-porous container;
   (b) immersing said container in a solution containing the elemental component or components of said semiconductor crystal; and
   (c) maintaining said solution at a predetermined elevated anneal temperature, whereby said semiconductor crystal is brought into intimate contact with equilibriating elemental gases from said solution while being completely isolated from any direct physical contact with the source of said gases.

2. A process for annealing a solid body which comprises:
   (a) inserting said solid body into a material containing the element or elements of said body and creating a predefined isolation space surrounding said body, without allowing said material to physically contact said body,
   (b) passing gases from said material to said body whereby said solid body is exposed to chosen equilibriating ambient gases which tend to prevent dissociation or decomposition of said body, and
   (c) heating said solid body at a chosen anneal temperature and for a time sufficient to electrically activate said solid body or remove damage in the crystallographic structure thereof.

* * * * *